(12) United States Patent
Suzuki et al.

(10) Patent No.: US 7,116,581 B2
(45) Date of Patent: Oct. 3, 2006

(54) NONVOLATILE SEMICONDUCTOR MEMORY DEVICE AND METHOD OF PROGRAMMING IN NONVOLATILE SEMICONDUCTOR MEMORY DEVICE

(75) Inventors: Junichi Suzuki, Kawasaki (JP); Kohji Kanamori, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 43 days.

(21) Appl. No.: 11/059,382

(22) Filed: Feb. 17, 2005

(65) Prior Publication Data

US 2005/0185470 A1    Aug. 25, 2005

(30) Foreign Application Priority Data

Feb. 19, 2004    (JP) ............................. 2004-042312

(51) Int. Cl.
 *G11C 16/04* (2006.01)
(52) U.S. Cl. ........................... 365/185.19; 365/185.22; 365/185.24
(58) Field of Classification Search .................... None
See application file for complete search history.

(56) References Cited

U.S. PATENT DOCUMENTS 5,751,637 A * 5/1998 Chen et al. ............ 365/185.33
6,801,457 B1 * 10/2004 Tanzawa et al. ....... 365/185.22

FOREIGN PATENT DOCUMENTS

JP       2001-357693       12/2001

\* cited by examiner

*Primary Examiner*—Thong Q. Le
(74) *Attorney, Agent, or Firm*—Young & Thompson (57) ABSTRACT

A memory cell array includes a plurality of memory cells each of which has a control gate and a floating gate. A programming circuit operates in a first programming mode followed by a second programming mode. In the first programming mode, the programming circuit applies a first program pulse to first memory cells while progressively increasing a programming capability of the first program pulse until threshold voltages of the first memory cells become higher than or equal to a first reference voltage. In the second programming mode, the programming circuit applies a second program pulse to second memory cells included in the first memory cells and having threshold voltages lower than a second reference voltage that is higher than the first reference voltage until the threshold voltages of the second memory cells become higher than or equal to the second reference voltage.

19 Claims, 9 Drawing Sheets

NONVOLATILE SEMICONDUCTOR MEMORY DEVICE AND METHOD OF PROGRAMMING IN NONVOLATILE SEMICONDUCTOR MEMORY DEVICE

BACKGROUND OF THE INVENTION

1. Field of the Invention

The present invention relates to a nonvolatile semiconductor memory device and a method of programming in the nonvolatile semiconductor memory device. More specifically, the present invention relates to a nonvolatile semiconductor memory device having a plurality of memory cells each of which can store a multi-level data, and a method of programming in the nonvolatile semiconductor memory device.

2. Description of the Related Art

Generally speaking, a nonvolatile semiconductor memory device such as a flash memory includes a plurality of memory cells each of which has a stacked gate structure (floating gate structure). That is to say, in a MOS transistor of the memory cell, a floating gate is provided between a substrate and a control gate. When charges are injected into the floating gate, a threshold value (threshold voltage) of each memory cell varies in accordance with the amount of the injected charges. In such a nonvolatile semiconductor memory device, the threshold voltages are correlated with data stored in the memory cell. Thus, by detecting the threshold voltage of each memory cell, the data stored in each memory cell can be read out.

A "programming" means an injection of the charges into a floating gate. In the programming of a memory cell, a predetermined potential is applied to source/drain, and a high potential is applied to a control gate of the memory cell. Accordingly, charges are injected into a floating gate of the memory cell. The programming may be performed for a plurality of memory cells by using one program pulse, which causes increase of a difference in the threshold voltage between a memory cell to which charges are injected at high-speed (high-efficiency) and a memory cell to which charges are injected at low-speed (low-efficiency). In order to prevent such a problem, a "verify (verifying step)" is generally carried out after the "programming". In the verify, whether or not a desired amount of charges have been injected to the floating gate is checked. That is, in the verify, whether or not the threshold voltage of the memory cell have become a desired value.

Figure 1:
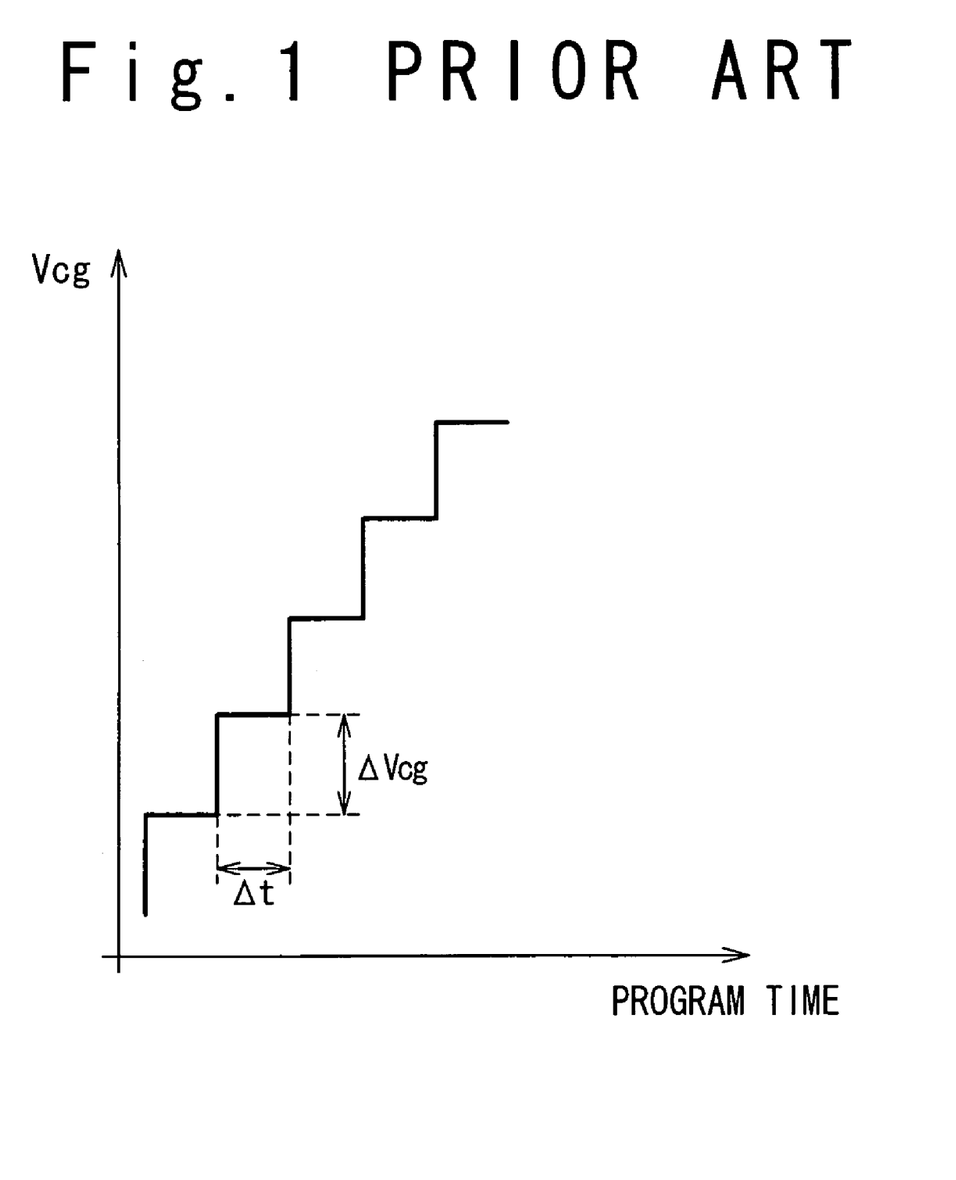
FIG. 1 is a graph showing a relationship between a voltage applied to a control gate and the number of programming operations when a memory cell is programmed according to a conventional programming method.

FIG. 1 shows a relationship between a voltage Vcg applied to a control gate and a program time (the number of programming operations) when a memory cell is programmed according to a conventional programming method. In the conventional programming, as shown in FIG. 1, the voltage Vcg applied to the control gate of the memory cell is increases by $\Delta Vcg$ as the number of programming operations increases. After every time the voltage is applied, a verify operation is performed to verify whether the threshold voltage of the memory cell has exceeded a predetermined value. With regard to the memory cell whose threshold voltage is determined by the verify operation to exceed the predetermined value, the programming is completed at that state. On the other hand, with regard to the memory cell whose threshold voltage is not determined to exceed the predetermined value, the programming operation continues until the threshold voltage reaches the predetermined value.

Figure 2:
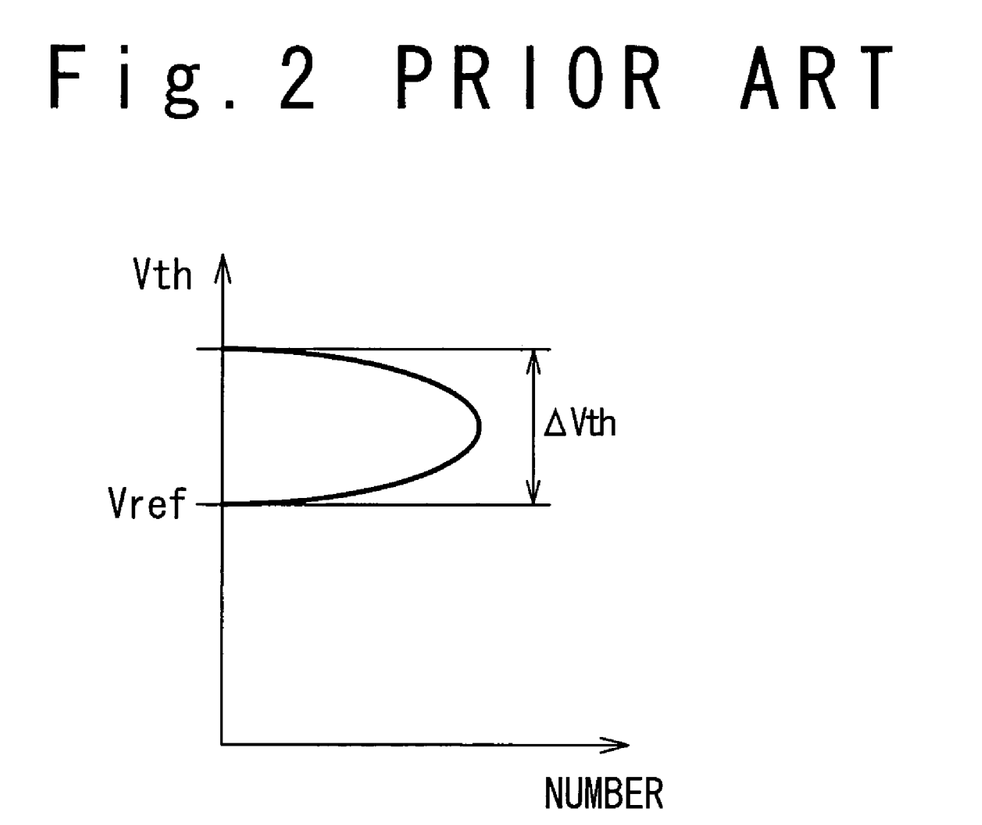
FIG. 2 is a graph showing a distribution of threshold voltages of memory cells programmed in accordance with the conventional programming method.

FIG. 2 shows a threshold voltage distribution with respect to the plurality of memory cells which are programmed according to the above-mentioned conventional method. The threshold voltage Vth is represented in the ordinate, and the number of memory cells is represented in the abscissa. A width $\Delta Vth$ of the threshold voltage distribution represents the difference in the threshold voltage among the plurality of memory cells. That is, the threshold voltage Vth of each memory cell is in a range from the predetermined value Vref to Vref+$\Delta Vth$. Since the voltage of the program pulse is increased by $\Delta Vcg$ according to the above-mentioned conventional programming, the width $\Delta Vth$ is in proportion to $\Delta Vcg$.

In such a nonvolatile semiconductor memory device, the threshold voltages are correlated with the data stored in the memory cell. For example, each memory cell is programmed such that the data "0" corresponds to the higher threshold value and the data "1" corresponds to the lower threshold value.

Also, a multi-level storing technique is known as a technique for increasing the storage density in a nonvolatile semiconductor memory device. According to the multi-level storing technique, data of at least two bits can be stored in a single memory cell. Such a memory cell is called as an MLC (Multi-Level Cell). For example, in a four-level nonvolatile semiconductor memory device, a four-level memory cell can store 2-bit data "00", "01", "10" and "11". Each memory cell is programmed to have a threshold voltage corresponding to any one of the "00", "01", "10" and "11" in accordance with the programmed data.

According to the multi-level (multi-bit) nonvolatile semiconductor memory device, two adjacent threshold voltage distributions corresponding to different storage data are close to each other as compared with a two-value (single-bit) nonvolatile semiconductor memory device. The narrower margin can cause a read error and hence deterioration of reading accuracy. As such, it is required to reduce the distribution width $\Delta Vth$ with regard to the threshold voltages of the memory cells shown in FIG. 2 as possible. In the programming shown in FIG. 1, the program pulse increment $\Delta Vcg$ may be set to a smaller value for the purpose of narrowing the distribution width $\Delta Vth$ and widening the margin. In this case, however, there are problems in that the number of programming operations increases and hence the time necessary for the programming increases.

Figure 3:
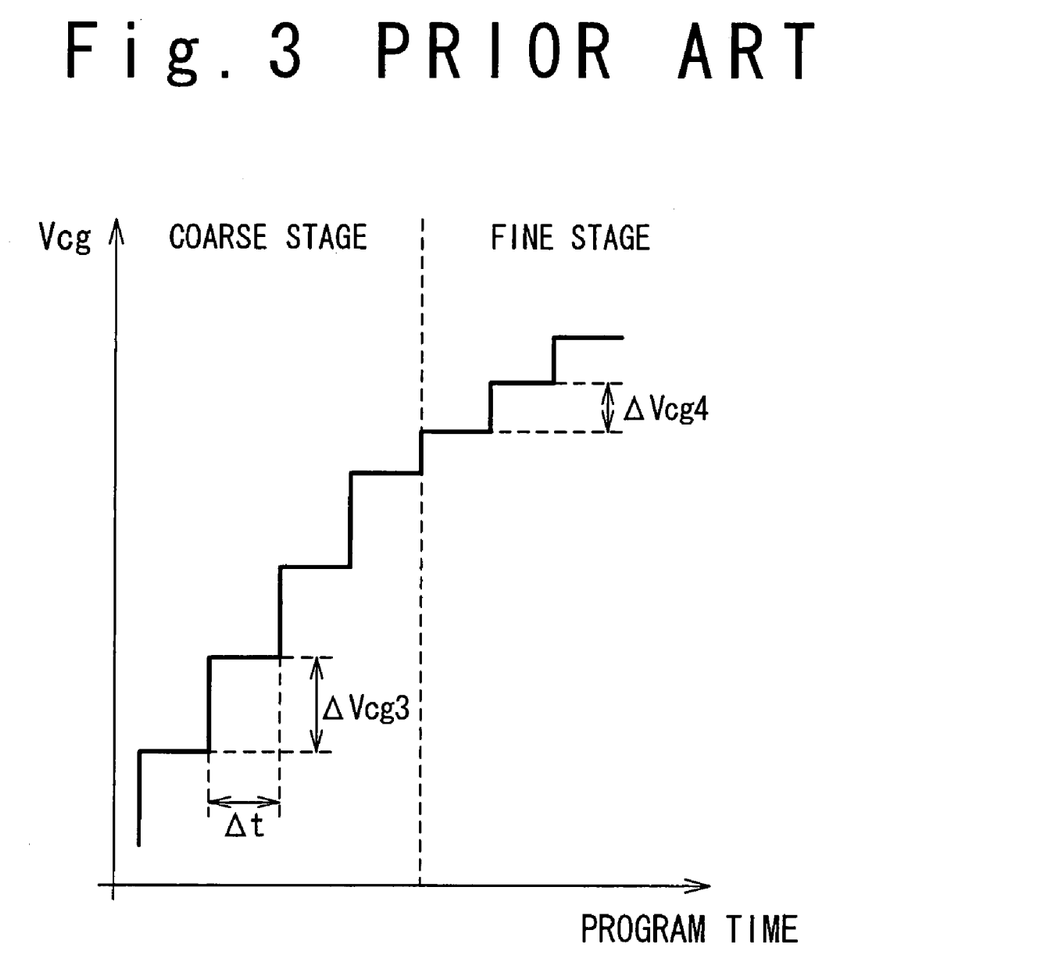
FIG. 3 is a graph showing a relationship between a voltage applied to a control gate and the number of programming operations when a memory cell is programmed by another conventional programming method.

A technique for reducing the time required for the programming and for narrowing the distribution width is disclosed in Japanese Unexamined Patent Publication No. 2001-357693 (Patent Document No. 1). FIG. 3 shows a relationship between a voltage Vcg applied to a control gate and a program time (the number of programming operations) when a memory cell is programmed according to the method described in the Patent Document No. 1. According to the method, the programming operation is classified into a coarse stage and a fine stage. The programming in the coarse stage is performed until a threshold voltage of a memory cell exceeds a first reference level (Vref3) while incrementing the program voltage by $\Delta Vcg\mathbf{3}$. The programming in the fine stage is performed until the threshold voltage of the memory cell exceeds a second reference level (Vref4) while incrementing the program voltage by $\Delta Vcg\mathbf{4}$. The increment width $\Delta Vcg\mathbf{4}$ of the program pulse in the fine stage is set smaller than the increment width $\Delta Vcg\mathbf{3}$ of the program pulse in the coarse stage.

Figure 4:
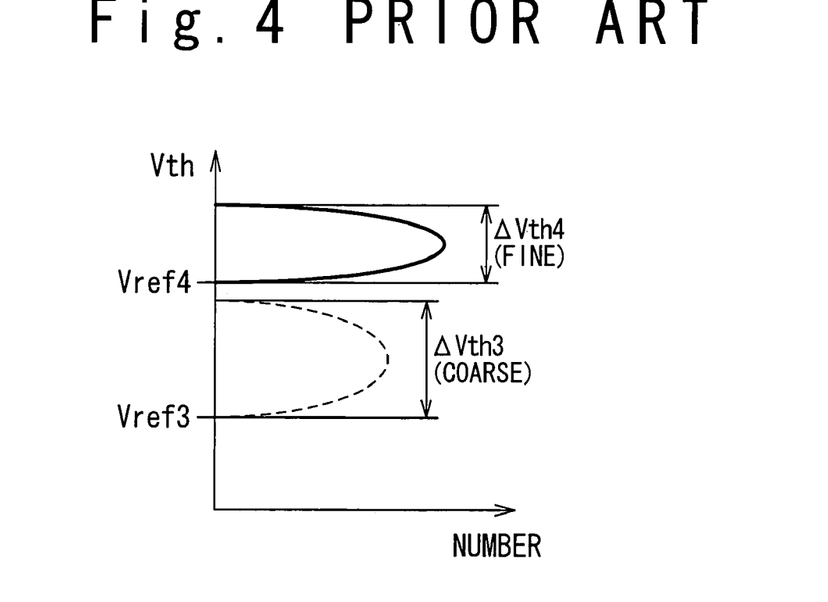
FIG. 4 is a graph showing a threshold voltage distribution as of completion of a coarse stage, and a threshold distribution as of completion of a fine stage according to the other conventional programming method.

FIG. 4 shows a threshold voltage distribution just after the coarse stage and a threshold voltage distribution just after the fine stage. It is described in the above-referenced Patent Document No. 1 that the first reference value (level) Vref3 is preferably set to a value obtained by subtracting a value more than the increment width $\Delta Vcg\mathbf{3}$ in the coarse stage from the second reference value (level) Vref4. A distribution width ΔVth3 of the threshold voltage distribution after the completion of the coarse stage is proportional to the increment width ΔVcg3. After the coarse stage, the programming in the fine stage is carried out. As a result, a final threshold voltage distribution is obtained as shown in FIG. 4, whose width ΔVth4 is proportional to the increment width ΔVcg4. The final distribution width ΔVth4 obtained after the fine stage is narrower than the distribution width ΔVth3 obtained just after the coarse stage, as shown in FIG. 4.

Figure 5:
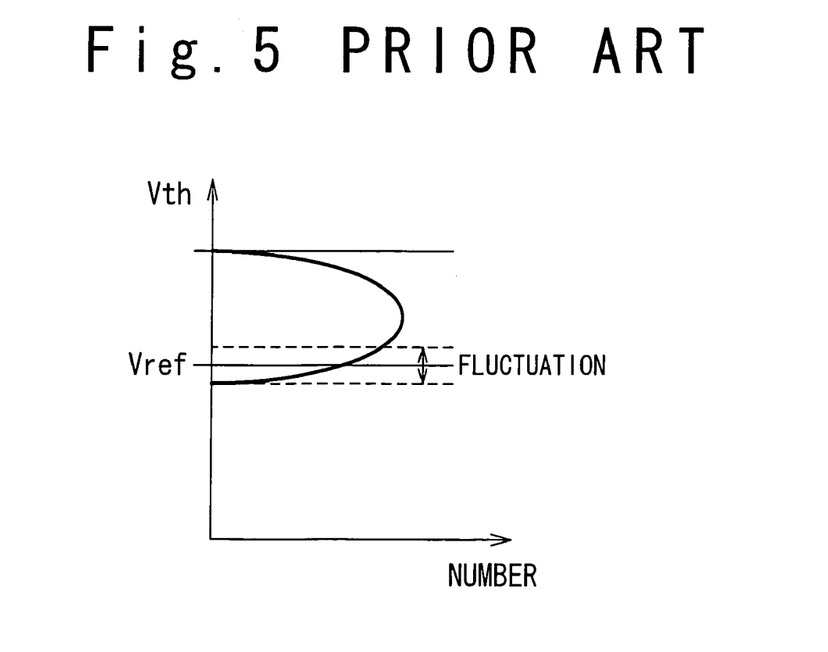
FIG. 5 is a graph showing a threshold voltage distribution of the memory cells when a reference voltage used in a verifying operation fluctuates according to the conventional programming methods.

According to the conventional technique, as described above, the plurality of program pulses are used and successively applied in the programming (see FIGS. 1 and 3). Whether the threshold voltage exceeds the reference value Vref (see FIG. 2) or not is checked in the verifying operation. Thus, the post-programming threshold voltage is controlled to be a desired threshold voltage level. However, the reference value Vref can fluctuate due to influences of noises. In this case, as shown in FIG. 5, the threshold voltages of a part of the memory cells remain lower than the reference value Vref, and hence the final threshold voltage distribution expands to the lower side with regard to the threshold voltage. Such a problem can also occur in the case of the above-mentioned Patent Document No. 1. In other words, the final threshold voltage distribution after the fine stage expands to below the desired reference level Vref4.

SUMMARY OF THE INVENTION

Therefore, an object of the present invention is to provide a nonvolatile semiconductor memory device and a method of programming thereof, which can make a width of threshold voltage distribution narrower.

Another object of the present invention is to provide a nonvolatile semiconductor memory device and a method of programming thereof, which can improve accuracy in a read operation.

In an aspect of the present invention, a method of programming a memory cell having a floating gate structure in a nonvolatile semiconductor memory device includes a first programming step and a second programming step. In the first programming step, a first program pulse is applied to first memory cells while progressively increasing a programming capability of the first program pulse until threshold voltages of the first memory cells become higher than or equal to a first reference voltage. The programming capability is defined by a product of a pulse voltage and a pulse width. In the second programming step, a second program pulse is applied to second memory cells included in the first memory cells and having threshold voltages lower than a second reference voltage that is higher than the first reference voltage until the threshold voltages of the second memory cells become higher than or equal to the second reference voltage. A programming capability of the second program pulse is lower than or equal to a programming capability of a final program pulse that is the first program pulse applied last in the first programming step.

According to the method mentioned above, a threshold voltage of a memory cell becomes higher than or equal to the first reference voltage in the first programming step. When the threshold voltage of the memory cell is lower than the second reference voltage that is higher than the first reference voltage, the threshold voltage is set to higher than or equal to the second reference voltage in the following second programming step. Here, the programming capability of the second program pulse applied to a control gate of the memory cell during the second programming step is lower than the programming capability of the final program pulse applied last in the first programming step. Therefore, a rate of increase in the threshold voltage in the second programming step is lower than a rate of increase in the threshold voltage in the first programming step. Thus, when the second reference voltage is set to a value slightly higher than the first reference voltage, the threshold voltage of the memory cell which is programmed in the second programming step does not exceed an upper bound of the threshold voltage distribution obtained due to the first programming step. In other words, the upper bound of the threshold voltage distribution obtained by the first programming step does not increase, while a lower bound of the threshold voltage distribution increases. Thus, a width of the threshold voltage distribution becomes narrower due to the second programming step, and hence a margin between two adjacent distributions becomes wider. Therefore, the accuracy in a read operation is improved.

In the method according to the present invention, the second reference voltage is lower than an upper bound of a threshold voltage distribution of the first memory cells obtained in the first programming step.

A pulse voltage of the second program pulse can be lower than or equal to a pulse voltage of the final program pulse. A pulse width of the second program pulse can be lower than or equal to a pulse width of the final program pulse.

In another aspect of the present invention, a method of programming a memory cell having a floating gate structure in a nonvolatile semiconductor memory device includes: a first programming step of applying a first program pulse to a memory cell; a first verifying step of verifying whether a threshold voltage of the memory cell becomes higher than or equal to a first reference voltage; a repeating step of repeating the first programming step until the memory cell passes the first verifying step while progressively increasing a programming capability of the first program pulse; a second verifying step of verifying whether the threshold voltage of the memory cell becomes higher than or equal to a second reference voltage that is higher than the first reference voltage; and a second programming step of applying a second program pulse to the memory cell until the memory cell passes the second verifying step while keeping a programming capability of the second program pulse.

The programming capability of the second program pulse is lower than or equal to a programming capability of a final program pulse that is the first program pulse applied last in the repeating step.

In still another aspect of the present invention, a nonvolatile semiconductor memory device has a plurality of memory cells, a programming circuit, and a verifying circuit. Each of the plurality of memory cells has a floating gate structure. The programming circuit operates in a first programming mode and a second programming mode. The verifying circuit verifies whether a threshold voltage of a memory cell of the plurality of memory cells becomes higher than or equal to a predetermined voltage. In the first programming mode, the programming circuit applies a first program pulse to first memory cells of the plurality of memory cells while progressively increasing a programming capability of the first program pulse until the verifying circuit confirms that threshold voltages of the first memory cells become higher than or equal to a first reference voltage. In the second programming mode, the programming circuit applies a second program pulse to second memory cells until the verifying circuit confirms that the threshold voltages of the second memory cells become higher than or equal to a second reference voltage. The second memory cells are included in the first memory cells and have threshold voltages lower than a second reference voltage that is higher than the first reference voltage. A programming capability of the second program pulse is lower than or equal to a programming capability of a final program pulse that is the first program pulse applied last in the first programming mode.

The second reference voltage is lower than an upper bound of a threshold voltage distribution of the first memory cells obtained in the first programming mode.

A pulse voltage of the second program pulse can be lower than or equal to a pulse voltage of the final program pulse. A pulse width of the second program pulse can be lower than or equal to a pulse width of the final program pulse.

In still another aspect of the present invention, a nonvolatile semiconductor memory device has a memory cell which is programmed by successive programming steps, a programming circuit for applying a program pulse to the memory cell in respective of the programming steps, and a verifying circuit for determining whether a programming result with respect to the memory cell to which the program pulse is applied passes or fails. The programming circuit includes a pulse generator. The pulse generator generates the program pulse with increasing a programming capability every programming step in a first programming stage, and generates the program pulse with keeping a programming capability in a second programming stage following the first programming stage. The verifying circuit determines whether the programming result passes or fails based on a first reference voltage in the first programming stage and based on a second reference voltage that is higher than the first reference voltage in the second programming stage.

The pulse generator sets the programming capability in the second programming stage to be lower than or equal to the programming capability of the program pulse generated at a last programming step in the first programming stage. A pulse voltage of the program pulse in the second programming stage may be set to be lower than or equal to a pulse voltage of the program pulse generated at the last programming step. A pulse width of the program pulse in the second programming stage may be set to be lower than or equal to a pulse width of the program pulse generated at the last programming step.

The programming circuit can further include a condition register which indicates the first programming stage or the second programming stage.

According to the nonvolatile semiconductor memory device and the method of programming, The programming capability of the second program pulse applied in the second programming mode (step) is lower than the programming capability of the final program pulse applied last in the first programming mode (step). Therefore, a rate of increase in the threshold voltage in the second programming step is lower than a rate of increase in the threshold voltage in the first programming step. Thus, the threshold voltage of the memory cell which is programmed in the second programming step does not exceed an upper bound of the threshold voltage distribution obtained due to the first programming step. In other words, the upper bound of the threshold voltage distribution obtained by the first programming step does not increase, while a lower bound of the threshold voltage distribution increases. Thus, a width of the threshold voltage distribution becomes narrower due to the second programming step, and hence a margin between two adjacent distributions becomes wider. Therefore, the accuracy in a read operation is improved.

DESCRIPTION OF THE PREFERRED EMBODIMENTS

Figure 6:
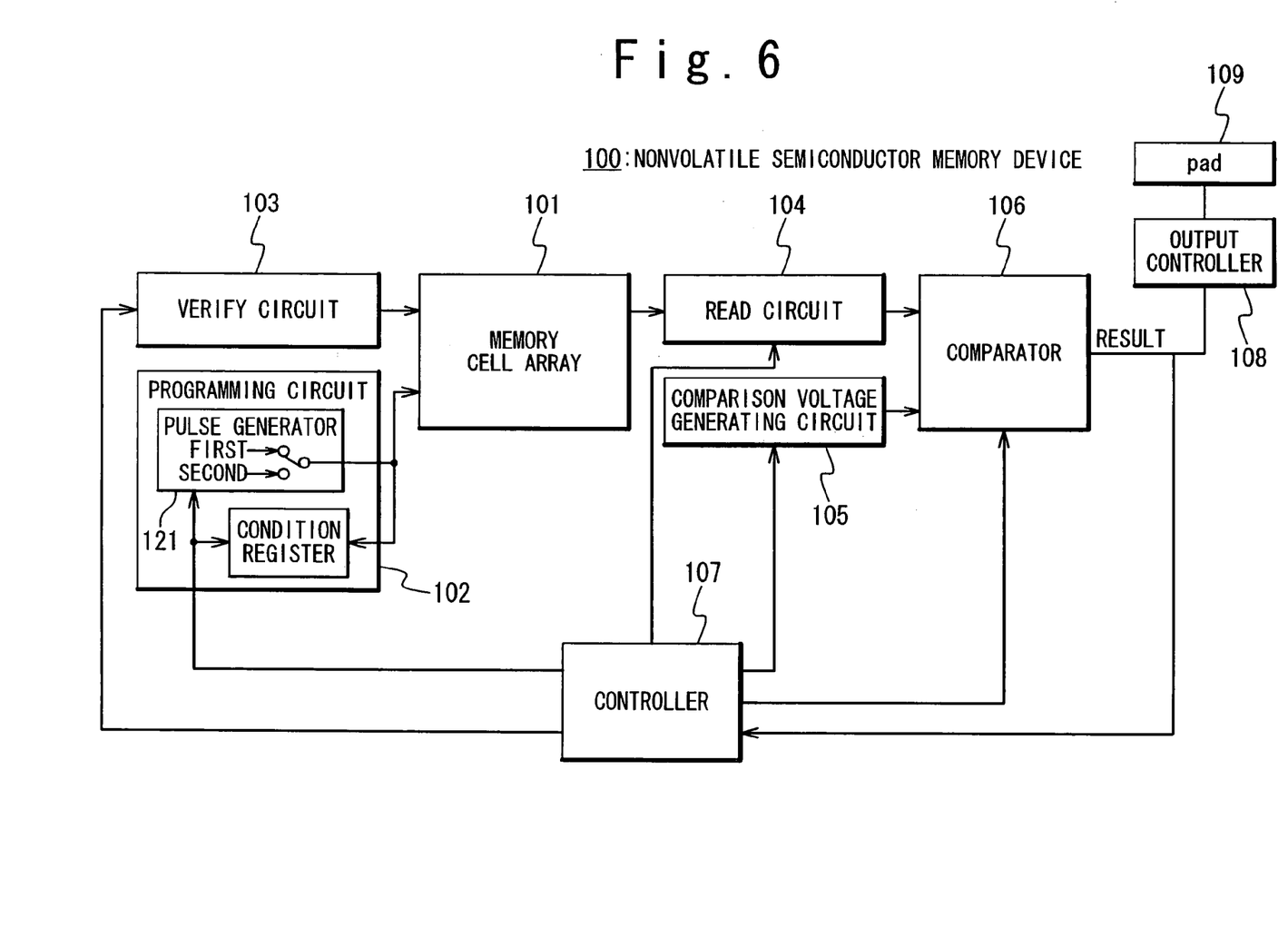
FIG. 6 is a block diagram showing a nonvolatile semiconductor memory device according to an embodiment of the present invention.

Embodiments of the present invention will be described below with reference to the attached drawings. FIG. 6 shows a nonvolatile semiconductor memory device 100 including a programming device according to an embodiment of the present invention. The nonvolatile semiconductor memory device 100 has a memory cell array 101, a programming circuit 102 (writing circuit), a verify circuit 103, a read circuit 104, a comparison voltage generating circuit 105, a comparator 106, and a controller 107. The programming circuit 102, the verify circuit 103, the read circuit 104, the comparison voltage generating circuit 105, the comparator 106, and the controller 107 configure the programming device.

The memory cell array 101, which is the target of the programming, is configured as a flash memory cell array. The memory cell array 101 includes a plurality of memory cells which are arrayed in a matrix form. Each of the memory cells has a stacked gate structure (floating gate structure). That is to say, in a MOS transistor of the memory cell, a floating gate is provided between a substrate and a control gate. Also, each memory cell is an MLC (Multi-Level Cell).

Programming of the memory cell includes a programming step for applying a program pulse to the memory cell (the control gate), and a verifying step for verifying (checking) whether a threshold voltage of the memory cell becomes higher than or equal to a desired value (level). A programming step is followed by a verifying step. A pair of the programming step and the verifying step is performed successively until the threshold voltage of the memory cell satisfies the desired value. Each memory cell is programmed by the successive programming steps and the successive verifying steps.

Also, according to the present embodiment, the programming of the memory cell can be classified into a "first programming stage" and a "second programming stage". In other words, the nonvolatile semiconductor memory device 100 (the programming circuit 102) is configured to operate in a "first programming mode" during the first programming stage and a "second programming mode" during the second programming stage. In each programming stage, the pair of the programming step and the verifying step is performed successively. As described later, the first programming stage and the second programming stage are performed in a different way.

The programming circuit 102 has a pulse generator 121 and a condition register 122. The pulse generator 121 generates a program pulse which is applied to the control gate of the memory cell in each programming step. The condition register 122 stores information indicative of whether the current programming step is in the first programming stage or in the second programming stage. By referring to the condition register 122, the pulse generator 121 determines the program pulse to be generated. The pulse generator 121 generates a "first program pulse" during the first programming stage, while generates a "second program pulse" during the second programming stage.

The verify circuit 103, the read circuit 104, the comparison voltage generating circuit 105, and the comparator 106 configure a means for verifying (a verifying circuit). In the verifying step, the verifying circuit checks (verifies) whether the threshold voltage of the memory cell is higher than or equal to a predetermined voltage (reference voltage). In other words, the verifying circuit determines whether the result of the programming step passes or fails.

The verify circuit 103 applies verify voltage to respective of the control gate and the drain of the memory cell in the verifying step. The read circuit 104 has a sense amp (amplifier) and reads a cell voltage from each memory cell. The comparison voltage generating circuit 105 generates a comparison voltage used for determining whether or not an electric current flows between the source and the drain. For example, the comparison voltage generating circuit 105 generates as the comparison voltage a half voltage of the verify voltage applied to the control gate. The comparator 106 performs a comparison between the cell voltage which is outputted from the read circuit 104 and the comparison voltage which is outputted from the comparison voltage generating circuit 105. Then, the comparator 106 outputs a result of the comparison to the controller 107. The controller 107 controls operations of the programming circuit 102, the verify circuit 103, the read circuit 104, the comparison voltage generating circuit 105, and the comparator 106. Thereby, the controller 107 instructs operation timings and operation voltages of the respective circuits. Upon completion of the programming of all the memory cells in the memory cell array 101, an output controller 108 outputs a signal indicative of the completion to the outside through a pad 109.

Figure 7:
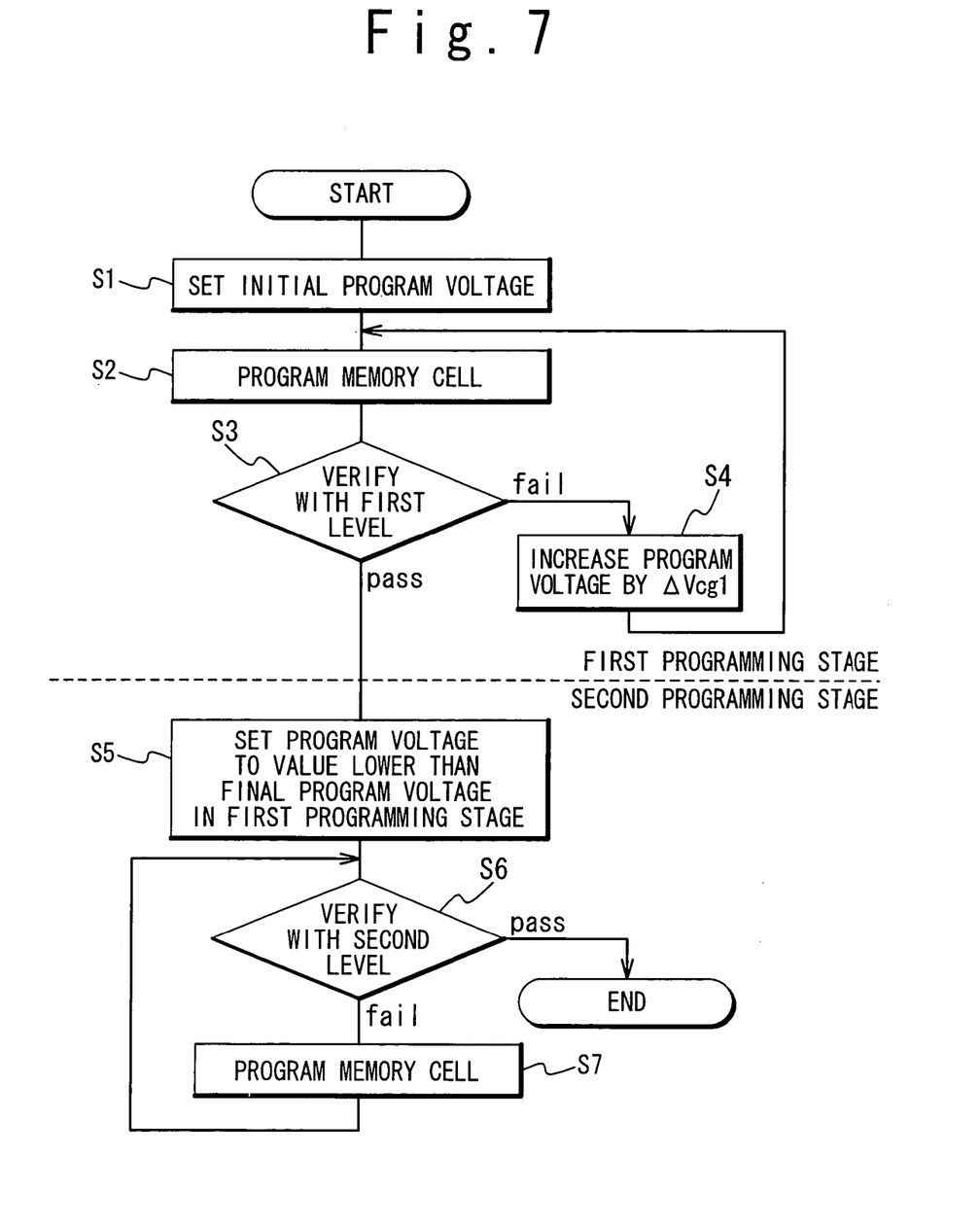
FIG. 7 is a flow chart showing processes of programming in the nonvolatile semiconductor memory device according to the embodiment of the present invention.
Figure 8:
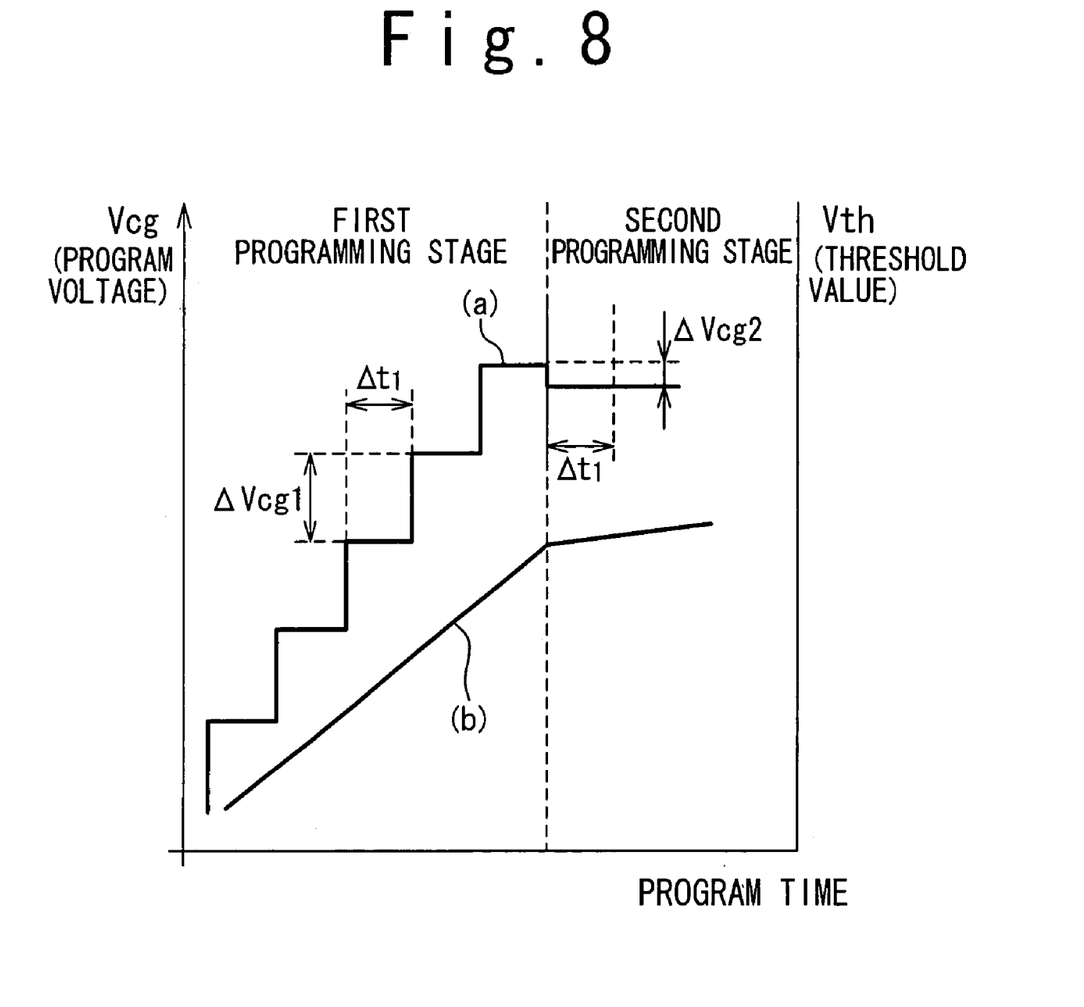
FIG. 8 is a graph showing a relationship between an applied voltage and the number of programming operations, and a relationship between a threshold voltage and the number of programming operations according to the embodiment of the present invention.

FIG. 7 is a flow chart showing programming processes in the nonvolatile semiconductor storage device 100. FIG. 8 shows a relationship between a program voltage Vcg applied to the control gate in the programming step and the program time (the number of programming operations), and a relationship between a threshold voltage (value) Vth and the number of programming operations. According to the present embodiment, the programming is classified into the first programming stage and the second programming stage. As described below, in the first programming stage, the threshold voltage of the memory cell is increased up to a predetermined level. In the second programming stage, a lower bound of a threshold voltage distribution of the memory cells obtained in the first programming stage is slightly increased.

First, the controller 107 writes information indicative of the first programming stage to the condition register 122. In the first programming stage, the pulse generator 121 generates a "first program pulse" as the program pulse applied to the memory cell. The pulse generator 121 sets the program voltage of an initial program pulse to an initial value (initial program voltage). The initial program pulse is used for the first programming step in the first programming stage (Step S1). The controller 107 instructs the verify circuit 103 to generate a "first reference voltage Vref1" as the verify voltage. In addition, the controller 107 instructs the comparison voltage generating circuit 105 to generate a half-level voltage (0.5*Vref1) of the first reference voltage Vref1. The programming circuit 102 programs a memory cell by applying the initial program voltage generated at the Step S1 to the control gate of the memory cell (first memory cell) and applying a predetermined voltage to the drain of the memory cell (Step S2).

Next, the verify circuit 103 applies a predetermined voltage to the drain of the memory cell and applies the first reference voltage Vref1 to the control gate of the memory cell. The comparator 106 performs a comparison between a cell voltage which is read out from the memory cell by the read circuit 104 and the comparison voltage generated by the comparison voltage generating circuit 105. Thus, the verifying is performed with regard to the first reference voltage (first level) (Step S3). When the cell voltage outputted from the read circuit 104 is lower than or equal to the comparison voltage (0.5*Vref1) outputted from the comparison voltage generating circuit 105, it is determined that a current does not flow between the source and the drain of the memory cell. In other words, it is determined that the threshold voltage of the memory cell becomes higher than or equal to the first reference voltage Vref1. According to the above-mentioned Step S3, based on the result of the comparison by the comparator 106, the controller 107 determines that a memory cell whose threshold value is confirmed to be higher than or equal to the first reference voltage Vref1 passes the verification ("Pass"), and determines that a memory cell whose threshold valued is confirmed to be lower than the first reference voltage Vref1 fails the verification ("Fail").

As to a memory cell which is determined to be "Pass" as a result of the verifying operation at the Step S3, the first programming stage is completed. On the other hand, as to a memory cell which is determined to be "Fail" as a result of the verifying operation, the process returns to the Step S2 and the programming is carried out again. In this case, each time the number of programming operations is incremented, the pulse generator 121 generates a program voltage that is higher than the previous program voltage by ΔVcg1 (Step S4). Thus, as shown by the graph (a) in FIG. 8, the program voltage Vcg applied to the control gate of the memory cell increases as the number of programming operations is incremented. In other words, a "programming capability" of the first program pulse is progressively increased step-by-step as the number of programming operations is incremented. Here, the programming capability is defined by a product of a pulse voltage (program voltage Vcg) and a pulse width ($\Delta t1$).

As shown by the graph (b) in FIG. 8, the threshold voltage Vth of the memory cell increases as the number of programming operations is incremented. In the first programming stage, the Step S2 to the Step S4 are repeatedly carried out until the memory cell passes the verification. In other words, the Step S2 to the Step S4 are repeatedly carried out until the threshold voltage Vth of the memory cell reaches the first reference voltage Vref1. Similar operation is performed for all the target memory cells (first memory cells). The controller 107 iterates the first programming stage until all the first memory cells are determined to be "Pass" at the Step S3. As a result, the threshold value Vth of each of the first memory cells is set to higher than or equal to the first reference voltage.

Figure 9:
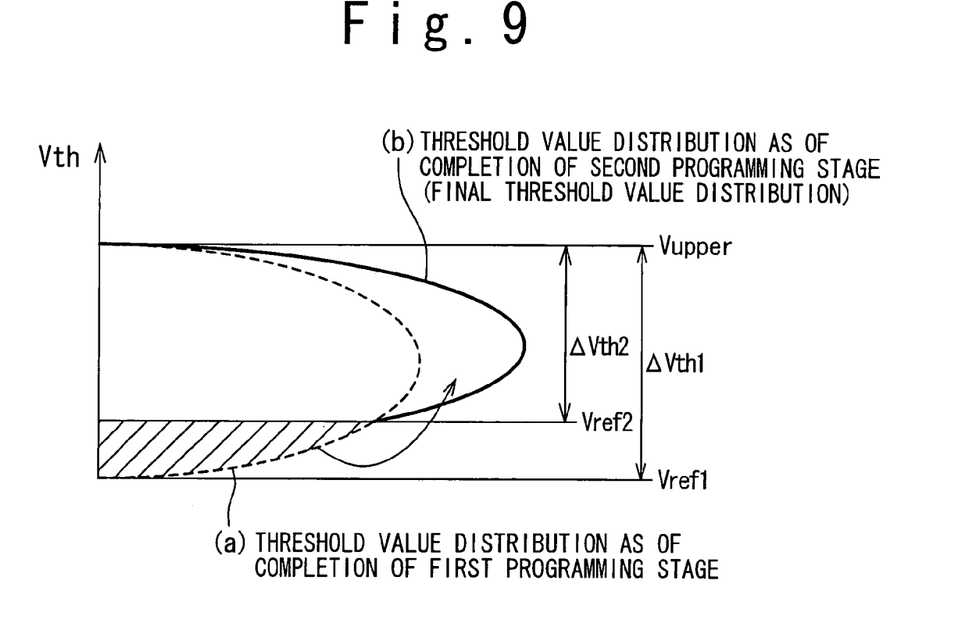
FIG. 9 is a graph showing a threshold voltage distribution as of completion of a first programming stage, and a threshold voltage distribution as of completion of a second programming stage according to the embodiment of the present invention.

A threshold voltage distribution as of completion of a first programming stage is shown in FIG. 9. As shown by the graph (a) in FIG. 9, when the first programming stage is completed, the threshold voltages of the respective memory cells distribute in a range of from the first reference voltage Vref1 to an upper bound voltage Vupper. By using a distribution width $\Delta Vth1$, the upper bound voltage Vupper is expressed as (Vupper=Vref1+$\Delta Vth1$). The distribution width $\Delta Vth1$ is proportional to the increment width $\Delta Vcg1$.

According to the present embodiment, the first programming stage is followed by the second programming stage. After the completion of the first programming stage, the controller 107 writes information indicative of the second programming stage to the condition register 122. In the second programming stage, the pulse generator 121 generates a "second program pulse" as the program pulse applied to the memory cell. The pulse generator 121 sets the program voltage of the second program pulse to a value lower by a predetermined width $\Delta Vcg2$ than the final program voltage in the first programming stage (Step S5). The final program voltage is the program voltage of the final program pulse applied last in the first programming stage.

Also, the controller 107 instructs the verify circuit 103 to generate a "second reference voltage Vref2" as the verify voltage. In addition, the controller 107 instructs the comparison voltage generating circuit 105 to generate a half-level voltage (0.5*Vref2) of the second reference voltage Vref2. The second reference voltage Vref2 is higher than the first reference voltage Vref1 (see FIG. 9). Also, the second reference voltage Vref2 is lower than the upper bound voltage Vupper, i.e., an upper bound of the threshold voltage distribution of the first memory cells obtained in the first programming stage. For example, the second reference voltage Vref2 is set to a value slightly higher than the first reference voltage Vref1.

First, the verify circuit 103 applies a predetermined voltage to the drain of the memory cell and applies the second reference voltage Vref2 to the control gate of the memory cell. The comparator 106 performs a comparison between a cell voltage which is read out from the memory cell by the read circuit 104 and the comparison voltage generated by the comparison voltage generating circuit 105. Thus, the verifying is performed with regard to the second reference voltage (second level) (Step S6). When the cell voltage outputted from the read circuit 104 is lower than or equal to the comparison voltage (0.5*Vref2) outputted from the comparison voltage generating circuit 105, it is determined that a current does not flow between the source and the drain of the memory cell. In other words, it is determined that the threshold voltage of the memory cell is higher than or equal to the second reference voltage Vref2. According to the above-mentioned Step S6, based on the result of the comparison by the comparator 106, the controller 107 determines that a memory cell whose threshold value is confirmed to be higher than or equal to the second reference voltage Vref2 passes the verification ("Pass"), and determines that a memory cell whose threshold valued is confirmed to be lower than the second reference voltage Vref2 fails the verification ("Fail").

As to a memory cell which is determined to be "Pass" as a result of the verifying operation at the Step S6, the second programming stage is completed. However, parts of the first memory cells programmed in the first programming stage have threshold values lower than the second reference voltage Vref2, as indicated by a hatched region in FIG. 9. Such memory cells whose threshold values immediately after the first programming stage are higher than the first reference voltage Vref1 but lower than the second reference voltage Vref2 are referred as second memory cells. In the first Step S6 after the first programming stage, the second memory cells are determined to be "Fail". The programming circuit 102 repeatedly applies the second program pulse set in the Step S5 to the second memory cells until the threshold values of the second memory cells become higher than or equal to the second reference voltage Vref2 (Step S7). In other words, the second programming stage is continuously performed until the second memory cells passes the verifying step S6. As a result, a lower bound of the threshold voltage distribution increases up to the second reference voltage Vref2, as shown by the graph (b) in FIG. 9.

The programming capability is defined by a product of a pulse voltage (program voltage) and a pulse width. According to the present embodiment, the pulse width of the second program pulse in the second programming stage is set to $\Delta t1$ which is the same as that of the first program pulse in the first programming stage. As described above, the program voltage in the second programming stage is set to lower than the final program voltage in the first programming stage, as shown in FIG. 8. Also, the second program voltage in the second programming stage is kept constant as shown in FIG. 8. Therefore, the programming capability of the second program pulse in the second programming stage is lower than the programming capability of the final program pulse in the first programming stage. In this case, the rate of increase in the threshold voltage Vth is lower in the second programming stage than in the first programming stage as shown by the graph (b) in FIG. 8. As a result, an upper bound of the threshold voltage distribution does not change and is kept to the value Vupper even after the completion of the second programming stage, as shown by the graph (b) in FIG. 9.

Figure 10:
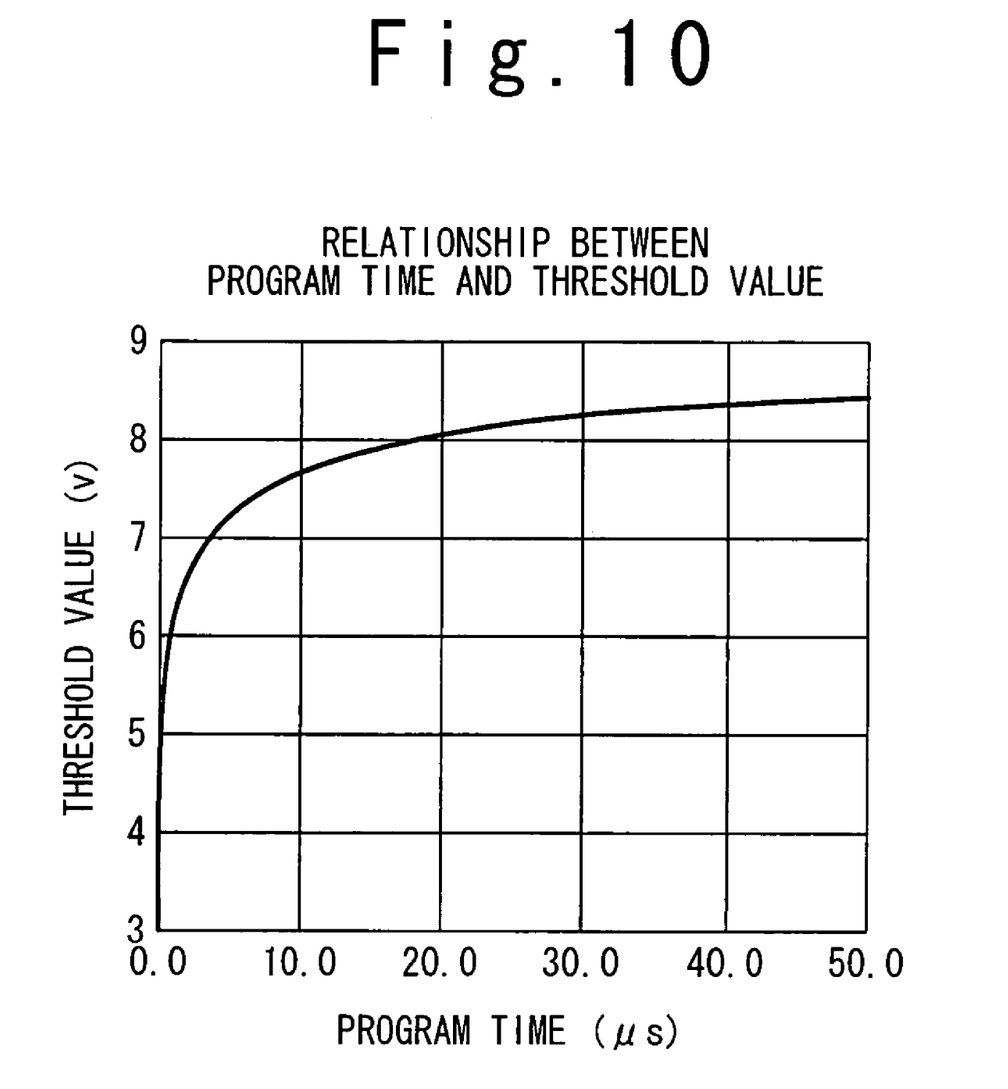
FIG. 10 is a graph showing a relationship between a program time and a threshold voltage when a voltage applied to a control gate is constant.

FIG. 10 shows a relationship between the program time and the threshold voltage when the program voltage to be applied to the control gate is kept constant. As shown in FIG. 10, in the event that the program voltage is the same, the threshold voltage exhibits saturation characteristics with respect to the program time (pulse width). As such, even when the second program voltage in the second programming stage is set to the same value as the final program voltage in the first programming stage instead of setting the second program voltage lower than the final program voltage, the rate of increase in the threshold voltage due to the second program pulse is lower than that due to the first program pulse. That is, the rate of increase in the threshold voltage Vth is lower in the second programming stage than in the first programming stage as shown by the graph (b) in FIG. 8. As described above, it is possible according to the present invention to set the second program voltage not only to a value lower than the final program voltage but also to the same value as the final program voltage.

In the above description, a pulse width (Δt1) of the second program pulse is set to the same value as that of the first program pulse. However, the pulse width of the second program pulse can be set to lower than that of the first program pulse. In this case, if the second program voltage in the second programming stage is the same as the final program voltage in the first programming stage, the programming capability in the second programming stage is lower than that in the first programming stage. Or, the second program voltage may be set such that the programming capability in the second programming stage is lower than that in the first programming stage.

The similar operations are performed for all the second memory cells. As a result of the second programming stage, a final threshold voltage distribution of all the memory cells is obtained as indicated by the graph (b) in FIG. 9. The lower bound of the final threshold voltage distribution is higher than that of the previous threshold voltage distribution just after the first programming stage. Moreover, the upper bound of the final threshold voltage distribution does not change as compared with the previous threshold voltage distribution. A width ΔVth2 of the final threshold voltage distribution is smaller than the previous distribution width ΔVth1, as shown in FIG. 9. Due to the second programming stage, the threshold voltage distribution is narrowed without shifting the upper bound.

As a comparative example, let us consider a case in which the memory cells are programmed according the conventional technique described in the above-mentioned Patent Document No. 1 (see FIG. 3). Here, it is assumed that a threshold voltage distribution shown by the graph (a) in FIG. 9 is obtained due to the coarse stage programming and the fine stage programming is carried out for the second memory cells whose threshold voltages are lower than the second reference voltage Vref2 slightly higher than the first reference voltage Vref1. As shown in FIG. 3, the program voltage in the fine stage is higher than the program voltage of the last program pulse in the coarse stage. That is to say, the programming capability in the fine stage is higher than the programming capability in the coarse stage. Accordingly, due to the fine stage programming, the threshold values of parts of the memory cells exceed the upper bound (Vupper) of the threshold voltage distribution obtained in the coarse stage. Thus, it is not possible according to the technique described in the Patent Document 1 to narrow the distribution width without shifting the upper bound of the threshold voltage distribution obtained in the coarse stage programming.

According to the present invention, the second programming stage is performed for the second memory cells whose threshold voltages are higher than the first reference voltage Vref1 but lower than the second reference voltage Vref2 upon completion of the first programming stage. Here, the programming capability of the second program pulse applied during the second programming stage is equal to or lower than the programming capability of the final program pulse applied last in the first programming stage. Therefore, the rate of increase in the threshold voltage in the second programming stage is lower than that in the first programming stage. Thus, the lower bound of the threshold voltage distribution increases, while the upper bound of the threshold voltage does not change in the second programming stage. The width of the threshold voltage distribution is narrowed from ΔVth1 to ΔVth2 as shown in FIG. 9. As the width of the threshold voltage distribution becomes narrower, a margin between two adjacent distributions becomes wider. Therefore, the accuracy in a read operation is improved.

In the present embodiment, an example is shown and described in which, after completion of the first programming stage for all the memory cells, the second programming stage is performed for the memory cells having the threshold voltage lower than the second reference voltage Vref2. Instead of the above example, the following operation is also possible. That is to say, the first programming stage and the second programming stage are performed every one memory cell. In this case, when a certain memory cell passes the Step S3 (first verification), the second programming stage is immediately carried out for the certain memory cell.

While the present invention is shown and described with reference to preferred embodiments thereof, the nonvolatile semiconductor memory device and the programming method according to the present invention are not limited to the above-described embodiments. It will be obvious to one skilled in the art that the present invention may be practiced in other embodiments that depart from the above-described specific details. The scope of the present invention, therefore, should be determined by the following claims.

What is claimed is:

1. A method of programming a memory cell having a floating gate structure in a nonvolatile semiconductor memory device, comprising:
    a first programming step of applying a first program pulse to first memory cells while progressively increasing a programming capability of said first program pulse until threshold voltages of said first memory cells become higher than or equal to a first reference voltage, said programming capability being defined by a product of a pulse voltage and a pulse width; and
    a second programming step of applying a second program pulse to second memory cells included in said first memory cells and having threshold voltages lower than a second reference voltage that is higher than said first reference voltage until said threshold voltages of said second memory cells become higher than or equal to said second reference voltage, a programming capability of said second program pulse being lower than or equal to a programming capability of a final program pulse that is said first program pulse applied last in said first programming step.

2. The method of programming according to claim 1, wherein said second reference voltage is lower than an upper bound of a threshold voltage distribution of said first memory cells obtained in said first programming step.

3. The method of programming according to claim 1, wherein a pulse voltage of said second program pulse is lower than or equal to a pulse voltage of said final program pulse.

4. The method of programming according to claim 2, wherein a pulse voltage of said second program pulse is lower than or equal to a pulse voltage of said final program pulse.

5. The method of programming according to claim 1, wherein a pulse width of said second program pulse is lower than or equal to a pulse width of said final program pulse.

6. The method of programming according to claim 2, wherein a pulse width of said second program pulse is lower than or equal to a pulse width of said final program pulse.

7. A method of programming a memory cell having a floating gate structure in a nonvolatile semiconductor memory device, comprising:
    a first programming step of applying a first program pulse to a memory cell;

a first verifying step of verifying whether a threshold voltage of said memory cell becomes higher than or equal to a first reference voltage;

a repeating step of repeating said first programming step until said memory cell passes said first verifying step while progressively increasing a programming capability of said first program pulse, said programming capability being defined by a product of a pulse voltage and a pulse width;

a second verifying step of verifying whether said threshold voltage of said memory cell becomes higher than or equal to a second reference voltage that is higher than said first reference voltage; and a second programming step of applying a second program pulse to said memory cell until said memory cell passes said second verifying step while keeping a programming capability of said second program pulse constant.

8. The method of programming according to claim 7, wherein said programming capability of said second program pulse is lower than or equal to a programming capability of a final program pulse that is said first program pulse applied last in said repeating step.

9. A nonvolatile semiconductor memory device comprising:

a plurality of memory cells each of which has a floating gate structure;

a programming circuit configured to operate in a first programming mode and a second programming mode; and a verifying circuit configured to verify whether a threshold voltage of a memory cell of said plurality of memory cells becomes higher than or equal to a predetermined voltage, wherein said programming circuit applies in said first programming mode a first program pulse to first memory cells of said plurality of memory cells while progressively increasing a programming capability of said first program pulse until said verifying circuit confirms that threshold voltages of said first memory cells become higher than or equal to a first reference voltage, said programming capability being defined by a product of a pulse voltage and a pulse width, and said programming circuit applies in said second programming mode a second program pulse to second memory cells included in said first memory cells and having threshold voltages lower than a second reference voltage that is higher than said first reference voltage until said verifying circuit confirms that said threshold voltages of said second memory cells become higher than or equal to said second reference voltage, a programming capability of said second program pulse being lower than or equal to a programming capability of a final program pulse that is said first program pulse applied last in said first programming mode.

10. The nonvolatile semiconductor memory device according to claim 9,
wherein said second reference voltage is lower than an upper bound of a threshold voltage distribution of said first memory cells obtained in said first programming mode.

11. The nonvolatile semiconductor memory device according to claim 9,
wherein a pulse voltage of said second program pulse is lower than or equal to a pulse voltage of said final program pulse.

12. The nonvolatile semiconductor memory device according to claim 10,
wherein a pulse voltage of said second program pulse is lower than or equal to a pulse voltage of said final program pulse.

13. The nonvolatile semiconductor memory device according to claim 9,
wherein a pulse width of said second program pulse is lower than or equal to a pulse width of said final program pulse.

14. The nonvolatile semiconductor memory device according to claim 10,
wherein a pulse width of said second program pulse is lower than or equal to a pulse width of said final program pulse.

15. A nonvolatile semiconductor memory device comprising:

a memory cell programmed by successive programming steps;

a programming circuit applying a program pulse to said memory cell in respective of said programming steps; and a verifying circuit determining whether a programming result with respect to said memory cell to which said program pulse is applied passes or fails, wherein said programming-circuit includes a pulse generator, said pulse generator generates said program pulse with increasing a programming capability every programming step in a first programming stage, and generates said program pulse with keeping a programming capability in a second programming stage following said first programming stage constant, said programming capability being defined by a product of a pulse voltage and a pulse width, and said verifying circuit determines whether said programming result passes or fails based on a first reference voltage in said first programming stage and based on a second reference voltage that is higher than said first reference voltage in said second programming stage.

16. The nonvolatile semiconductor memory device according to claim 15,
wherein said pulse generator sets said programming capability in said second programming stage to be lower than or equal to said programming capability of said program pulse generated at a last programming step in said first programming stage.

17. The nonvolatile semiconductor memory device according to claim 16,
wherein a pulse voltage of said program pulse in said second programming stage is set to be lower than or equal to a pulse voltage of said program pulse generated at said last programming step.

18. The nonvolatile semiconductor memory device according to claim 16,
wherein a pulse width of said program pulse in said second programming stage is set to be lower than or equal to a pulse width of said program pulse generated at said last programming step.

19. The nonvolatile semiconductor memory device according to claim 15,
wherein said programming circuit further includes a condition register which indicates said first programming stage or said second programming stage.

* * * * *